United States Patent
Blair et al.

(10) Patent No.: US 6,940,145 B2
(45) Date of Patent: Sep. 6, 2005

(54) TERMINATION STRUCTURE FOR A SEMICONDUCTOR DEVICE

(75) Inventors: Peter Blair, Urmston Manchester (GB); Adrian Finney, Chadderton Oldham (GB); Paul Gerrard, Didsbury Manchester (GB); Andrew Wood, Brabury Stuckport (GB); David Mottram, Shay Oldham (GB)

(73) Assignee: Zetex PLC (GB)

( * ) Notice: Subject to any disclaimer, the term of this patent is extended or adjusted under 35 U.S.C. 154(b) by 0 days.

(21) Appl. No.: 10/272,524

(22) Filed: Oct. 15, 2002

(65) Prior Publication Data
US 2003/0127702 A1 Jul. 10, 2003

(30) Foreign Application Priority Data
Oct. 16, 2001 (GB) .............................. 0124797

(51) Int. Cl.⁷ ......................................... H01L 21/8238
(52) U.S. Cl. ....................... 257/510; 257/506; 257/513; 257/519; 257/520; 257/501; 257/446; 257/499; 438/206; 438/207
(58) Field of Search ................................ 257/501, 510, 257/513, 519, 520, 446, 499, 395, 396, 397, 398, 399, 400, 487, 488; 438/206, 208

(56) References Cited

U.S. PATENT DOCUMENTS

| 5,126,807 A | | 6/1992 | Baba et al. |
| 5,233,215 A | * | 8/1993 | Baliga .......................... 257/490 |
| 5,242,845 A | | 9/1993 | Baba et al. |
| 5,525,821 A | | 6/1996 | Harada et al. |
| 5,597,765 A | * | 1/1997 | Yilmaz et al. ............... 437/203 |
| 5,614,751 A | * | 3/1997 | Yilmaz et al. ............... 257/394 |
| 5,877,528 A | * | 3/1999 | So ............................... 257/341 |
| 6,096,612 A | | 8/2000 | Houston |
| 6,396,090 B1 | * | 5/2002 | Hsu et al. .................... 257/242 |
| 2002/0011644 A1 | | 1/2002 | Lee |

* cited by examiner

Primary Examiner—Nathan J. Flynn
Assistant Examiner—Fazli Erdem
(74) Attorney, Agent, or Firm—Foley & Lardner LLP

(57) ABSTRACT

A semiconductor device (e.g. MOSFET or IGBT) comprises active and termination regions (1,2) formed in a semiconductor substrate (4). The substrate (4) has an upper surface and a termination including a trench (12) extending into the substrate (4) from the upper surface within the termination region (1). Termination trench (12) is at least partly filled with an insulating material (13) which extends from the termination trench (12) to overlie adjacent regions of the device above the surface. A channel stop region (11) extends laterally from a side wall of the termination trench (12) into the substrate (4).

32 Claims, 5 Drawing Sheets

TERMINATION STRUCTURE FOR A SEMICONDUCTOR DEVICE

CROSS-REFERENCE TO RELATED PATENT APPLICATIONS

Great Britain Priority Application 0124797.2, filed Oct. 16, 2001 including the specification, drawings, claims and abstract, is incorporated herein by reference in its entirety and is a basis for a priority filing date for the present patent disclosure.

BACKGROUND OF THE INVENTION

The present invention relates to a termination structure for a semi-conductor device. In particular, the invention relates to the provision of a channel stop to prevent undesirable surface leakage between the drain and source of a transistor device, such as a MOSFET, which has a trench gate structure.

Trench MOSFETS are a well known form of MOSFET in which the gate electrode is formed in a trench in a semi-conductor substrate. Application of an appropriate potential to the gate is used to establish a conducting channel between source and drain regions. It is also well known to provide a channel stop implant in the termination region of MOSFETS and similar devices to prevent undesirable surface leakage occurring due to unintentional channel formation.

Conventional channel stop structures comprise a heavily doped region provided in the termination region at the edge of the device to overcome doping depletion which could result in the leakage channel formation. Such structures are effective but have a disadvantage in that at least one additional masking step is required during the device fabrication to form the channel stop region.

One proposed solution to the above problem is disclosed in U.S. Pat. No. 5,614,751. This discloses a power MOSFET with a termination region provided with a channel stop comprising a trench lined with a thin layer of insulating oxide and filled with a conductive filler, such as polysilicon. The channel stop trench is formed simultaneously with the formation of trenches in the active area thus avoiding the need to provide a separate masking operation for formation of the channel stop. This trench channel stop structure, however, does not function as effectively as conventional implanted channel stop regions. The structure can be improved somewhat with the addition of an unmasked p-type implant operation—however this approach increases processing costs, and is also subject to the limitation that this applied p-type doping must necessarily be light with respect to the n-type doping level of the implanted body region. This consideration limits the effectiveness of the channel stop function provided by the p-type doped region in this structure.

It is an object of the present invention to obviate or mitigate the above disadvantages.

According to a first aspect of the present invention there is provided a semiconductor device comprising active and termination regions formed in a semiconductor substrate having an upper surface, a termination including a trench extending into the substrate from said upper surface within said termination region, wherein said termination trench is at least partly filled with an insulating material which extends from the termination trench to overlie adjacent regions of the device above said surface, and wherein a channel stop region extends laterally from a side wall of the termination trench into the substrate.

The structure according to the present invention includes a diffused or implanted channel stop which functions as effectively as conventional diffused channel stops, but which may be formed as parts of the active region are formed without the necessity for a dedicated masking or doping operation.

According to a second aspect of the present invention there is provided a method for forming a semiconductor device as defined above having active and termination regions, the method comprising providing a semiconductor substrate of a first conductive type and having a upper surface, forming a termination trench in the surface of said substrate in said termination region, and introducing a dopant into said substrate through at least a portion of a side wall of said termination trench to form said channel stop region.

Further preferred and advantageous features of the various ous aspect of the present invention will become apparent from the following description.

BRIEF DESCRIPTION OF THE DRAWINGS

Specific embodiments of the present invention will now be described, by way of example only, with reference to the accompanying drawings, in which.

DETAILED DESCRIPTION OF THE PREFERRED EMBODIMENTS

Figure 1:
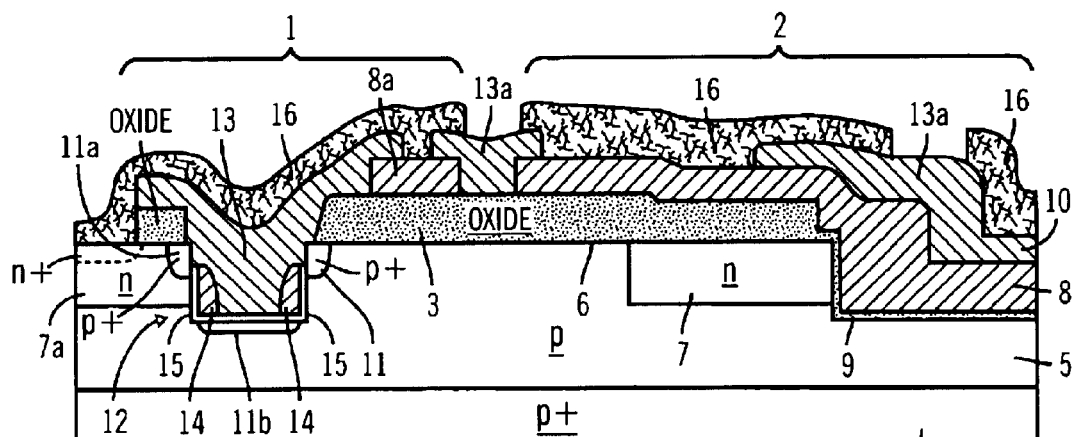
FIG. 1 is a schematic cross-section of a semiconductor device according to a first embodiment of the present invention.

FIG. 1 is a schematic cross-section through a trench MOSFET according to one embodiment of the present invention showing details of the termination region 1 and part of the adjacent active region 2, the termination and active regions being separated by a thick field oxide layer 3. The device comprises a $p^+$-type semiconductor substrate 4 which forms a drain region for the device and which supports a p-type drift/drain region 5 having an upper surface 6.

The active region 2 comprises an n-type body region 7 formed below the surface 6 and adjacent a trench gate structure which has a polysilicon gate region 8 isolated from the body and drift/drain regions by a gate insulation layer 9 and isolation layer 10. The active region 2 further comprises $p^+$ source regions which are not visible on the particular section illustrated.

The termination region 1 comprises a $p^+$ channel stop region 11 extending laterally into the drift/drain region 5 from the side wall of a termination trench 12 which is filled with isolation material 13. As a result of the particular fabrication process used to produce the device illustrated in FIG. 1, the termination trench 12 may be partially filled with polysilicon at regions 14 and includes a partial lining of gate oxide at regions 15. Additional $p^+$ regions 11a 11b are also incidentally formed through the side wall of the termination trench 12 opposite the channel stop region 5 and in the drift/drain region 11 below the bottom of the trench 12. In addition, an n-type body region 7a is present adjacent the termination trench 12 on the opposite side of the trench to the active region. These latter features 14, 15, 11a, 7a have no particular part to play in operation of the channel stop.

The device is further provided with appropriately patterned layers of polysilicon, isolation and metal at regions 8a, 13a and 16 respectively to provide the required contacts to the device.

As mentioned above, the termination trench does not itself provide the principal channel stopping function. Rather, the channel stop is the p+ region 11. Hence, the channel stop of the illustrated structure functions substantially in the same manner as conventional diffused/implanted channel stops. The invention, however, has the advantage over otherwise conventional channel stop structures in that the provision of the termination trench enables formation of the channel stop region simultaneously with formation of source regions (not shown). That is, the termination trench can be formed in the same etch process used to form the trenches in the active region and filled with polysilicon as polysilicon is deposited to form the gate regions. However, by arranging the polysilicon to only partially fill the termination trench, for instance by etching back the polysilicon in the termination trench as polysilicon is etched back from the gate trenches, at least a portion of the upper part of the side wall of the termination trench is clear of polysilicon to allow the p+ channel stop region to be implanted or diffused through the side wall of the termination trench in the same step as formation of the source regions in the active region. Accordingly, no separate dedicated masking or doping operation is required to form the channel stop region.

One example of a fabrication process suitable for producing the device structure of FIG. 1 will now be described with reference to FIGS. 2 to 9. Where appropriate the same reference in FIG. 1 will be used in FIGS. 2 to 9.

Figure 2:
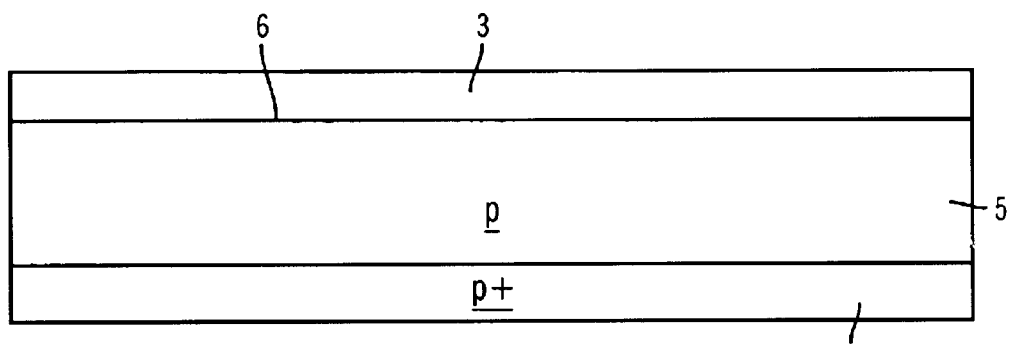
FIGS. 2 to 10 illustrate various steps on the fabrication of the device of FIG. 1.

Referring to FIG. 2, a p-type drift/drain region 5 is epitaxially grown on a p+-type substrate 4. The p+ region 5 defines an upper surface 6 on which a layer of field oxide 3 is provided, for instance by a process of thermal oxidation. The p+ substrate in effect forms the drain region of the device and will generally be much thicker than the layers it supports. The substrate is shown relatively thin in the drawings for the purposes of illustration only.

Figure 3:
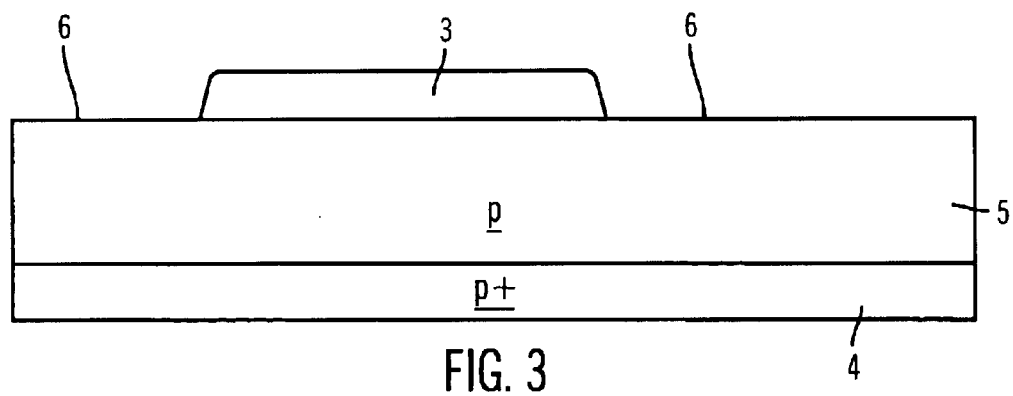
Figure 4:
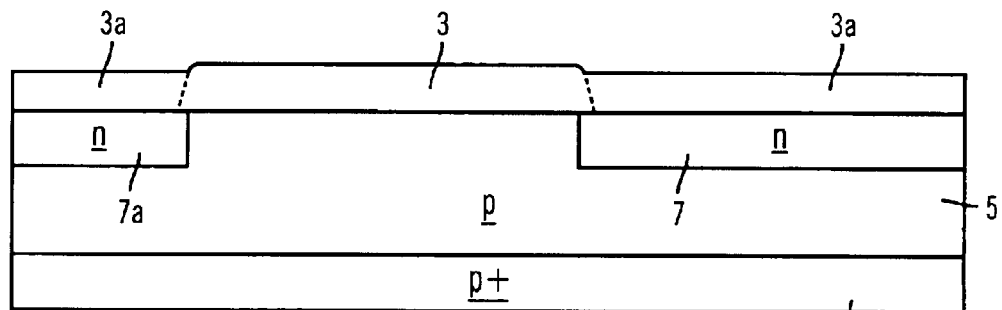

A first masking operation is then performed to pattern the field oxide layer 3 to selectively remove oxide in both the active region and the scribe lane of the termination region. The field oxide layer may for instance be patterned by a conventional process using photoresist. The resulting structure is illustrated in FIG. 3. The remaining field oxide 3 provides a mask for the formation of body regions by introducing a suitable n-type dopant into the p-type drift/drain region through the exposed parts of the surface 6. A layer of oxide is then re-grown over the body regions 7 and 7a to arrive at the structure illustrated in FIG. 4. The body regions 7 and 7a may be formed by a conventional implantation or diffusion process. For instance, the body regions 7 and 7a may be formed by a diffusion process at least partly carried in an oxidizing atmosphere to form the re-grown oxide layer 3a.

Figure 5:
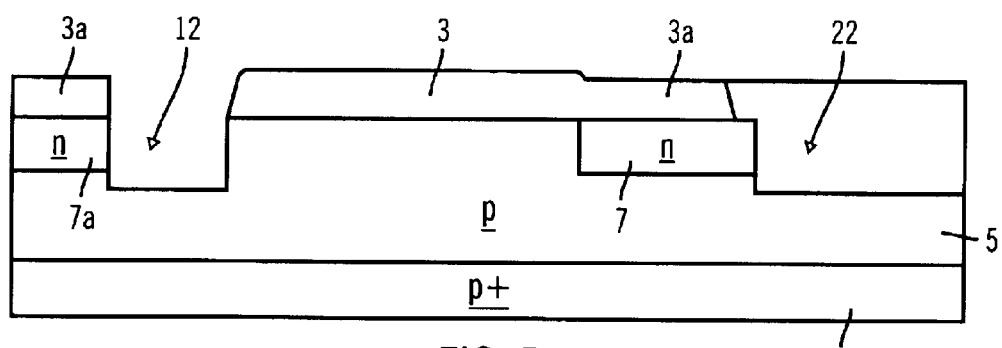

Referring now to FIG. 5, a second masking operation is then performed to pattern the oxide layer 3a and create an oxide hard mask which together with the remaining field oxide 3 defines the position of termination and gate trenches 12 and 22 which are then etched through the exposed regions 1 and 2 of the active and termination regions respectively (using any conventional method such as reactive ion etching). As will be apparent from FIG. 5 onwards, the cross-section corresponds to the cross section of FIG. 1 which is along the length of a gate trench 22 running at right angles to the termination trench 12. The width of the gate trench 22 is therefore not directly discernible from the figures. However, with the currently described embodiment the gate trench 22 is assumed to be narrower than the termination trench 12.

Figure 6:
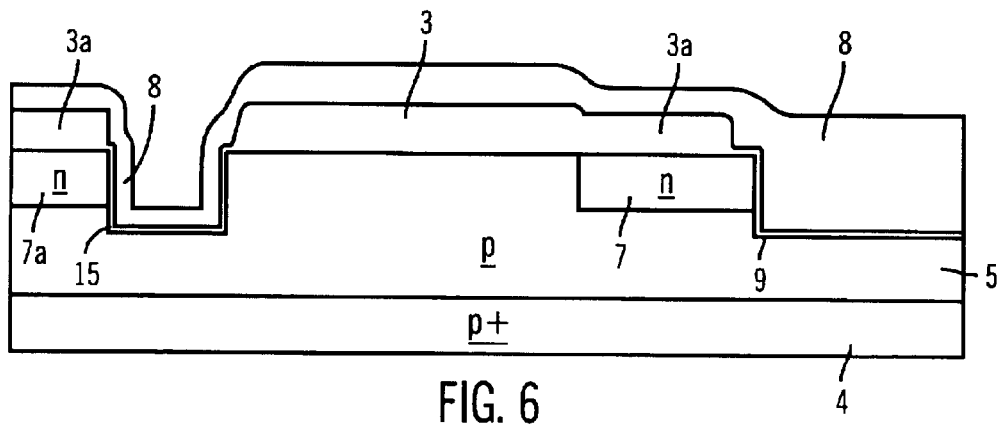

A thin oxide layer is then formed over the active and termination regions, for instance by thermal oxidation, to form a gate oxide layer 9 in the gate trench 22 (and an incidental gate oxide layer 15 in the termination trench 12). Polysilicon gate material 8 is then deposited over the device to a depth sufficient to completely fill the gate trench 22. Since the termination trench is wider than the gate trench 12, this is only partially filled with polysilicon 8. The resulting structure is illustrated in FIG. 6.

Figure 7:
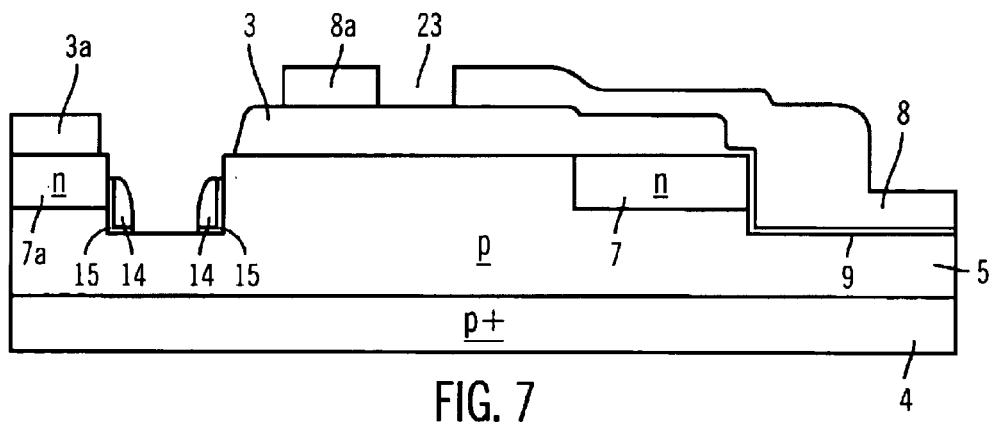

A third masking operation is then performed to pattern the polysilicon 8. The polysilicon 8 is coated with a layer of photoresist (not shown) which is patterned appropriately and an etching operation is performed to etch back the surface of the polysilicon 8 within the gate trench 22 and termination trench 12 to expose upper portions of the trench side walls (exposure of the gate trench side walls is not visible in the particular section illustrated in the drawings—although the fact that this will occur elsewhere can be determined from the way in which the poly surface is shown as being lower than the upper surface 6 in FIG. 7). Since the termination trench 12 is wider than the gate trench (so that the polysilicon 8 forms only a relatively thin layer on the surfaces of the termination trench 12) substantially all of the polysilicon 8 is removed from the termination trench. The resulting structure is illustrated in FIG. 7. Here it can be seen that the particular etch process used in this example has left small regions of polysilicon 14 residual in the termination trench 12 (an etch process designed to remove the poly entirely from the trench is an alternative possibility). Subsequent oxide etching has removed the gate oxide 9, 15 material where this is exposed through removal of polysilicon 8. Removal of the gate oxide as indicated may be desirable for some fabrication processes (as described below) but unnecessary for others. The etching process also removes polysilicon from region 23 above the field oxide layer 3.

Figure 8:
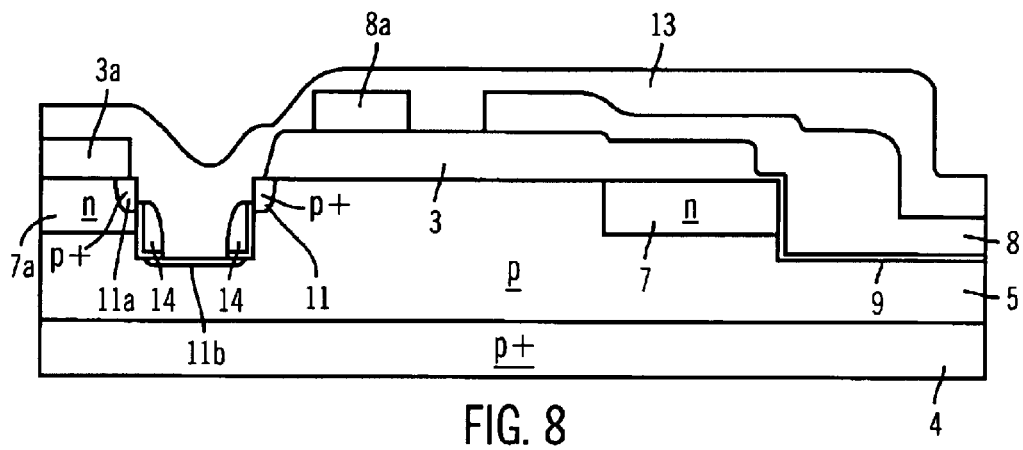
Figure 9:
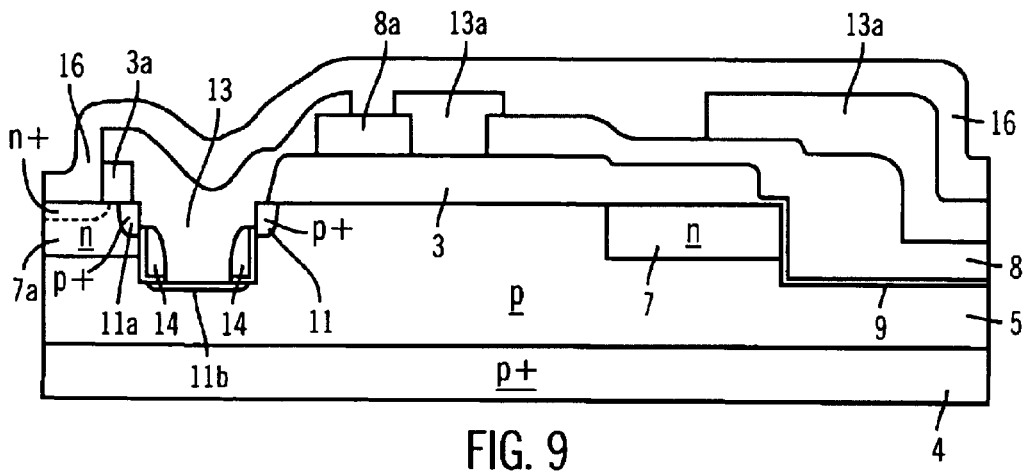

With reference to FIG. 8, source and channel stop regions 11 are then simultaneously formed by the introduction of a p-type dopant through the side walls of the gate and termination trenches 22,12 respectively (as mentioned above, the source regions are not visible in the drawings). The p-type dopant enters the drift/drain region 5 through both side walls of the termination trench 12, and also through the bottom of the termination trench 12, where the trench surface has been exposed by removal of polysilicon 8 and gate oxide 15. Only region 11 is required to provide a channel stop but regions 11a and 11b are formed incidentally. For instance, in some cases it may be that all of the polysilicon 8 and gate oxide 15 is removed from the termination trench 12 so that the p+ region extends all the way around the trench 12.

The dopant may be introduced by any suitable process. For instance, with the illustrated embodiment since the gate oxide layer 15 has been removed from appropriate regions of the trench 12 the dopant may be introduced by gaseous deposition. However, ion implantation could also be used and in this case it may be better to leave gate oxide on the walls of the termination trench to remove contaminants from the dopant as it is implanted. In either case the dopant is prevented from entering the drift/drain region 5 via the upper surface 6 by the retained field oxide 3 and the re-grown oxide layers 3a.

Following the formation of the source and channel stop regions an isolation layer 13 is deposited over the device to completely fill the trenches. This gives the structure illustrated in FIG. 8.

A fourth masking operation is then performed to pattern and etch the isolation layer 13 to allow contact to appropriate regions of the surface in the active region 2 and to the polysilicon layer 8,8a. The mask is patterned so that isolation 13 is not removed from the termination trench which remains isolated from the surrounding structure. Metal 16 is then deposited across the active and termination regions 1,2 giving the structure illustrated in FIG. 9.

A fifth and final masking operation is then performed to pattern the metal layer 16 to provide gate and source electrodes, plus other features such as an equipotential ring etc. This gives the final device structure shown in FIG. 1.

Figure 10:
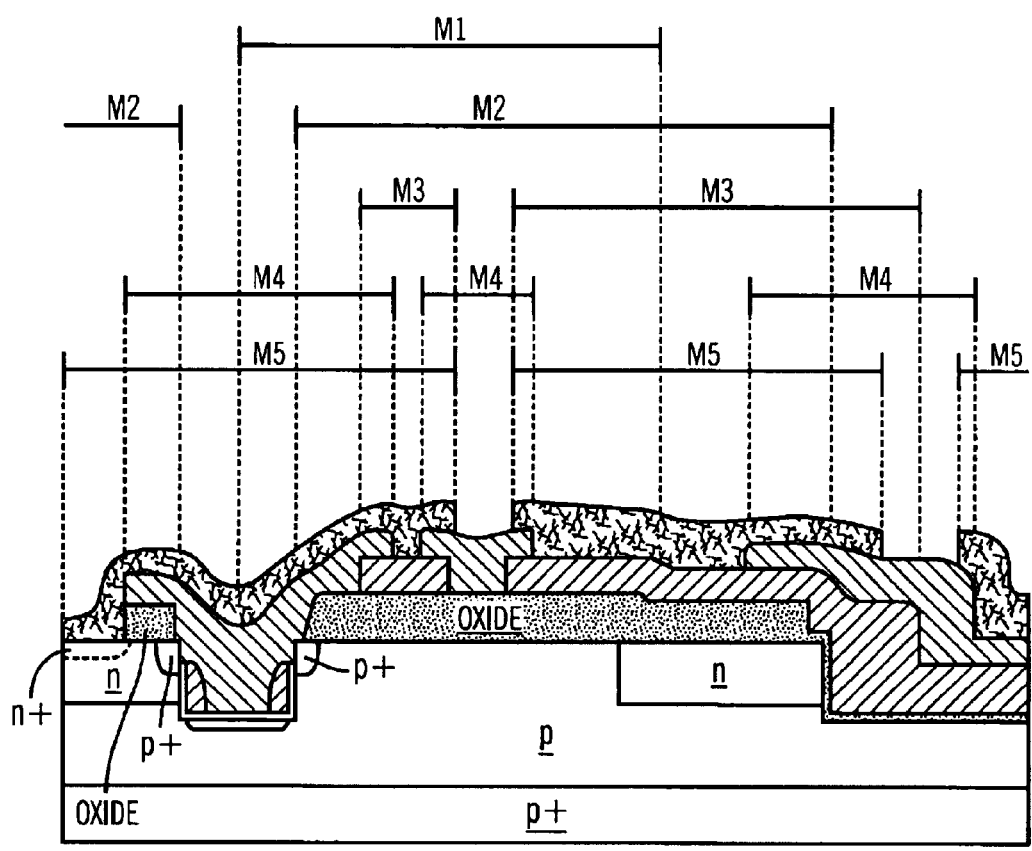

The structure of FIG. 1 is repeated in FIG. 10 together with an indication of the five masks used in the masking operations described above, identified as M1 to M5 respectively.

It will thus be seen that the present invention provides simultaneous formation of channel stop and source regions through the provision of a trench in the termination region which is formed simultaneously with trenches in the active region, so that no additional dedicated masking or doping steps are required for formation of the channel stop.

It will be appreciated that the various masking, etching, deposition and other process flow steps etc described above may be entirely conventional, and that the complete process flow may include many other additional conventional steps. The above description is intended to provide a simple explanation of the simultaneous formation of the channel stop and source regions, through provision of a termination trench.

Figure 11:
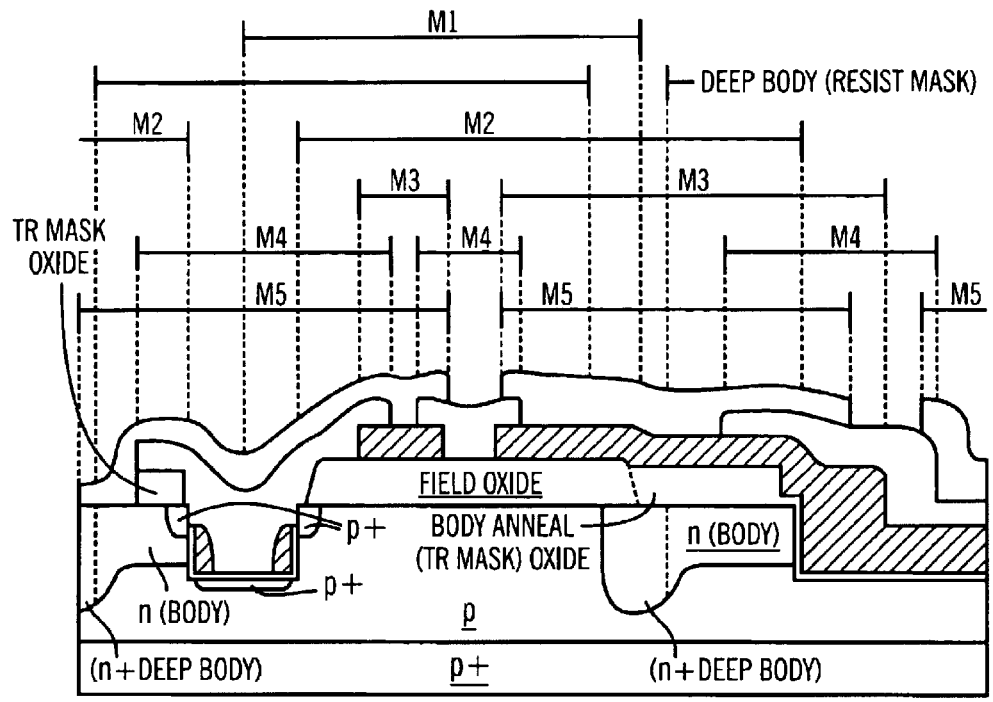
FIGS. 11 and 12 illustrate further embodiments of the invention.

Additional masking operations may for instance be added to produce variations of the above structure. For example, a "deep body" structure as shown in FIG. 11 can be produced by the addition of only one further mask operation, for example between the first and second masking operations described above. The additional mask operation is used to introduce an n-type dopant of heavier concentration than that used in the original body forming operation. The additional mask is illustrated in FIG. 11 as an intermediate masking stage between the first and second masking stages illustrated in FIG. 10. The deep body region is driven in at least partly in an oxidizing atmosphere to form a re-grown oxide on its surface. Alternatively, body and deep body regions may be combined and conformed in one step after a deep body doping stage.

Figure 12:
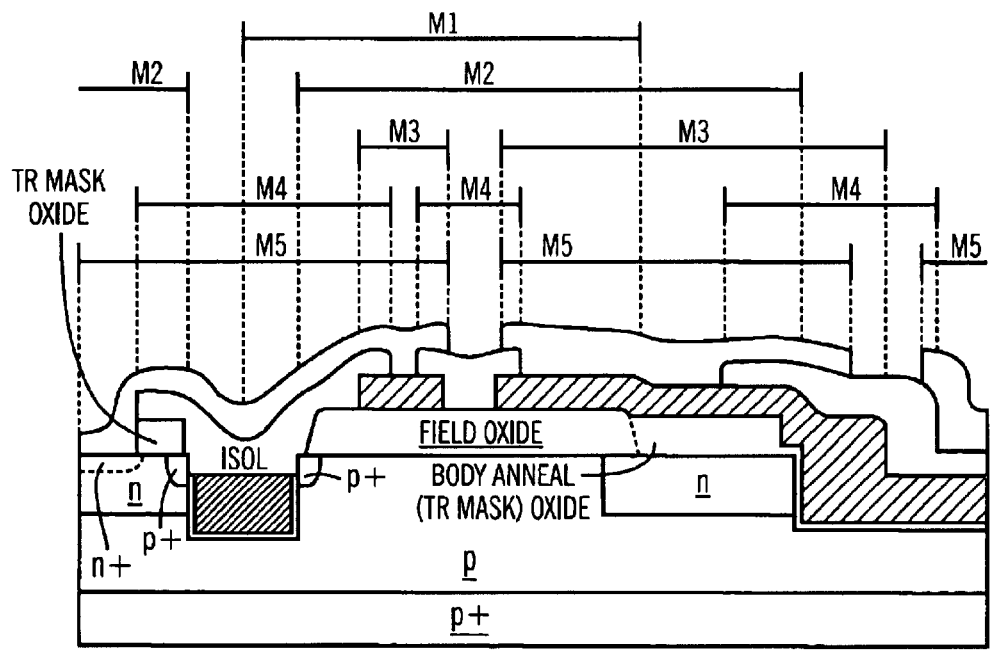

A further modification of the structures described above is illustrated in FIG. 12. This illustrates a device fabricated in the same way as the device of FIG. 1, involving exactly the same process steps, but in which the termination trench is of similar width or narrower than the gate trench. As a consequence, the termination trench is completely filled with polysilicon gate material following the second masking operation. The polysilicon is then etched back within the termination trench during the third masking operation as it is etched back within the gate trenches thereby exposing upper portions of the side wall of the termination trench for subsequent formation of the channel stop regions.

Many other possible modifications of the above structures may be made to provide a variety of known features. For instance, multiple channel stops may be provided by forming multiple trenches in the termination region (in this case some of the channel stop structures may perform the function of field retaining rings).

It will also be understood that whilst the invention has been described above with reference to a p-channel MOSFET it could equally be applied to an n-channel MOSFET simply by reversing the polarity of the various layers. Moreover, the invention is not limited in application to MOSFETS, or indeed field effect transistors, and can be applied to any semi-conductor device having a trench gate and requiring a channel stop. For instance, the provision of an additional layer beneath layer 1 of the above described examples, and having an opposite polarity to layer 1, would result in the formation of an IGBT structure. Other possible applications of the invention will be readily apparent to the appropriately skilled person.

What is claimed is:

1. A semiconductor device comprising active and termination regions formed in a semiconductor substrate having an upper surface, a termination including a trench extending into the substrate from said upper surface within said termination region, wherein said termination trench is at least partly filled with an insulating material which extends from the termination trench to overlie adjacent regions of the device above said surface, and wherein a channel stop region extends laterally from a side wall of the termination trench into the substrate, wherein said active region comprises at least one trench extending from said upper surface immediately adjacent a body region of a second conductivity type formed below said surface, and a region of substantially the same composition as the channel stop region extending laterally from the active trench into the body region.

2. A semiconductor device according to claim 1, wherein the channel stop region is immediately adjacent said upper surface.

3. A semiconductor device according to claim 1 or claim 2, wherein the channel stop region is of the same conductivity type as the substrate but has a higher dopant concentration than said substrate.

4. A device according to claim 1, wherein said active trench is a gate trench substantially filled with a gate material isolated from the substrate and body regions by a thin layer of gate insulator.

5. A semiconductor device according to claim 4, wherein said termination trench is at least partially lined with a layer of said gate insulator material.

6. A semiconductor device according to claim 5, wherein a lower portion of said termination trench is filled with gate material, said isolation material overlying said gate material within said termination trench.

7. A semiconductor device according to claim 6, wherein the termination trench is of similar width or narrower than the gate trench.

8. A semiconductor device according to claim 5, wherein at most only a small amount of said gate material is present in the termination trench underlying said isolation material.

9. A semiconductor device according to claim 8, wherein there is no gate material present within the termination trench.

10. A semiconductor device according to claim 8 or claim 9, wherein the termination trench is wider than said gate trench.

11. A semiconductor device according to claim 1, wherein the active and termination regions are at least in part separated by a field oxide layer formed on said upper surface of the substrate.

12. A semiconductor device according to claim 1, wherein an oxide layer is supported on the upper surface of said substrate adjacent opposing sides of said termination trench, and said insulating material extends from said termination trench to overlie said oxide layer.

13. A semiconductor device according to claim 1, wherein the device is a MOSFET or IGBT.

14. A method for forming a semiconductor device with active and termination regions formed in a semiconductor substrate having an upper surface, a termination including a trench extending into the substrate from said upper surface within said termination region, wherein said termination trench is at least partly filled with an insulating material which extends from the termination trench to overlie adjacent regions of the device above said surface, and wherein a channel stop region extends laterally from a side wall of the termination trench into the substrate, the method comprising providing a semiconductor substrate of a first conductivity type and having an upper surface, forming a termination trench in the surface of said substrate in said termination region, and introducing a dopant into said substrate through at least a portion of a side wall of said termination trench to form said channel stop region.

15. A method according to claim 14, wherein a masking layer is provided on said upper surface of the substrate to define the location of said termination trench inner trench sidewall.

16. A method according to claim 15, wherein said masking layer subsequently prevents dopant used to form the channel stop region from entering the substrate through said upper surface.

17. A method according to claim 16, wherein said masking layer is an oxide layer.

18. A method according to claim 17, wherein said masking layer includes a layer of field oxide located between termination and active regions of the device.

19. A method according to claim 14, further comprising the formation of an active trench within said active region simultaneously with the formation of said termination trench.

20. A method according to claim 19, wherein said masking layer defines the positions of both termination and active trenches.

21. A method according to claim 19, further comprising forming a insulation layer in the active and termination trenches and depositing a conductive material within said trenches over the insulation layer, and providing said gate material to a level below said upper surface, leaving at least upper portions of a side wall of the termination trench free of said conductive material for subsequent introduction of said channel region dopant.

22. A method according to claim 21, wherein the conductive material initially fills the trenches and is then etched back within the active and termination trenches to below the level of said upper surface of the substrate.

23. A method according to claim 14, wherein subsequent to formation of said channel stop region an insulating material is deposited to fill at least said termination trench.

24. A method according to claim 14, wherein the channel stop regions are formed simultaneously with the formation of source regions within the active region of the device by a single doping operation.

25. A semiconductor device, comprising active and termination regions formed in a semiconductor substrate having an upper surface, a termination including a trench extending into the substrate from said upper surface within said termination region:
   wherein said termination trench is at least partly filled with an insulating material which extends from the termination trench to overlie adjacent regions of the device above said surface, and wherein a channel stop region extends laterally from a side wall of the termination trench into the substrate;
   wherein an oxide layer is supported on the upper surface of said substrate adjacent opposing sides of said termination trench, and said insulating material extends from said termination trench to overlie said oxide layer; and
   wherein said active region comprises at least one trench extending from said upper surface immediately adjacent a body region of a second conductivity type formed below said surface, and a region of substantially the same composition as the channel stop region extending laterally from the active trench into the body region.

26. A semiconductor device according to claim 25, wherein said active trench is a gate trench substantially filled with a gate material isolated from the substrate and body regions by a thin layer of gate insulator.

27. A semiconductor device according to claim 26, wherein said termination trench is at least partially lined with a layer of said gate insulator material.

28. A semiconductor device according to claim 27, wherein a lower portion of said termination trench is filled with gate material, said isolation material overlying said gate material within said termination trench.

29. A semiconductor device according to claim 28, wherein the termination trench is of similar width or narrower than the gate trench.

30. A semiconductor device according to claim 27, wherein at most only a small amount of said gate material is present in the termination trench underlying said isolation material.

31. A semiconductor device according to claim 30, wherein there is no gate material present within the termination trench.

32. A semiconductor device according to claim 30 or claim 31, wherein the termination trench is wider than said gate trench.

* * * * *

UNITED STATES PATENT AND TRADEMARK OFFICE
CERTIFICATE OF CORRECTION

PATENT NO. : 6,940,145 B2
APPLICATION NO. : 10/272524
DATED : September 6, 2005
INVENTOR(S) : Peter H. Blair et al.

It is certified that error appears in the above-identified patent and that said Letters Patent is hereby corrected as shown below:

On The Title Page Item (75) Inventors should read --

Peter H. Blair, Urmston, Manchester (GB)

Adrian Finney, Upper Mill, Oldham (GB)

Paul A. Jerred, Didsbury, Manchester (GB)

Andrew C.G. Wood, Bredbury, Stockport (GB)

David D. Mottram, Shaw, Oldham (GB) --.

Signed and Sealed this

First Day of August, 2006

JON W. DUDAS
*Director of the United States Patent and Trademark Office*